US008817993B2

(12) United States Patent
Hsu et al.

(10) Patent No.: US 8,817,993 B2
(45) Date of Patent: Aug. 26, 2014

(54) AUDIO DEVICE WITH VOLUME ADJUSTING FUNCTION AND VOLUME ADJUSTING METHOD

(75) Inventors: Ying-Hao Hsu, New Taipei (TW); Chi-Sheng Ge, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 357 days.

(21) Appl. No.: 13/211,315

(22) Filed: Aug. 17, 2011

(65) Prior Publication Data

US 2013/0028444 A1 Jan. 31, 2013

(30) Foreign Application Priority Data

Jul. 26, 2011 (TW) .............................. 100126283 A

(51) Int. Cl.
*H03G 3/20* (2006.01)

(52) U.S. Cl.
USPC ............... 381/57; 381/56; 381/104; 381/107; 381/86

(58) Field of Classification Search
USPC ..................................... 381/104–109, 56–59
See application file for complete search history.

(56) References Cited

U.S. PATENT DOCUMENTS

| | | | | |
|---|---|---|---|---|
| 7,630,366 | B2 * | 12/2009 | Iwase et al. | 370/389 |
| 8,018,328 | B2 * | 9/2011 | Goldstein et al. | 340/384.1 |
| 8,494,172 | B2 * | 7/2013 | Cheek et al. | 381/57 |
| 2010/0226511 | A1 * | 9/2010 | Im et al. | 381/107 |
| 2012/0201393 | A1 * | 8/2012 | Cheek et al. | 381/57 |

* cited by examiner

*Primary Examiner* — Disler Paul
(74) *Attorney, Agent, or Firm* — Novak Druce Connolly Bove + Quigg LLP

(57) ABSTRACT

An audio device and a volume adjusting method are provided. The audio device includes a speed sensor, a first FIFO buffer unit, and a second FIFO buffer unit. The audio device generates audio signals by playing multimedia files and stores audio signals to the first FIFO buffer unit. The audio device collects ambient sound signals and stores collected sound signals to the second FIFO buffer unit. The audio device further analyzes stored audio signals and sound signals to determine a waveform of environmental noise signals, and determines a SPL of the environmental noise signals according to the determined waveform. The audio device then compares the determined SPL with a preset SPL and compares the sensed speed with a preset speed if the determined SPL is greater than the preset SPL, and adjusts the volume of audio signals according to a comparison result between the sensed speed and the preset speed.

2 Claims, 2 Drawing Sheets

AUDIO DEVICE WITH VOLUME ADJUSTING FUNCTION AND VOLUME ADJUSTING METHOD

BACKGROUND

1. Technical Field

The present disclosure relates to audio devices, and particularly, to an audio device capable of automatically adjusting the volume of audio signals outputted by the audio device and a volume adjusting method.

2. Description of Related Art

Typically, audio players, such as MP3 media players, cannot automatically adjust the volume of audio signals outputted by the audio players according to ambient noise. This automatic function can be especially useful in a moving environment where the noise level may change frequently.

BRIEF DESCRIPTION OF THE DRAWINGS

The components of the drawings are not necessarily drawn to scale, the emphasis instead being placed upon clearly illustrating the principles of an audio device with a volume adjusting function and a volume adjusting method. Moreover, in the drawings, like reference numerals designate corresponding parts throughout several views.

DETAILED DESCRIPTION

Figure 1:
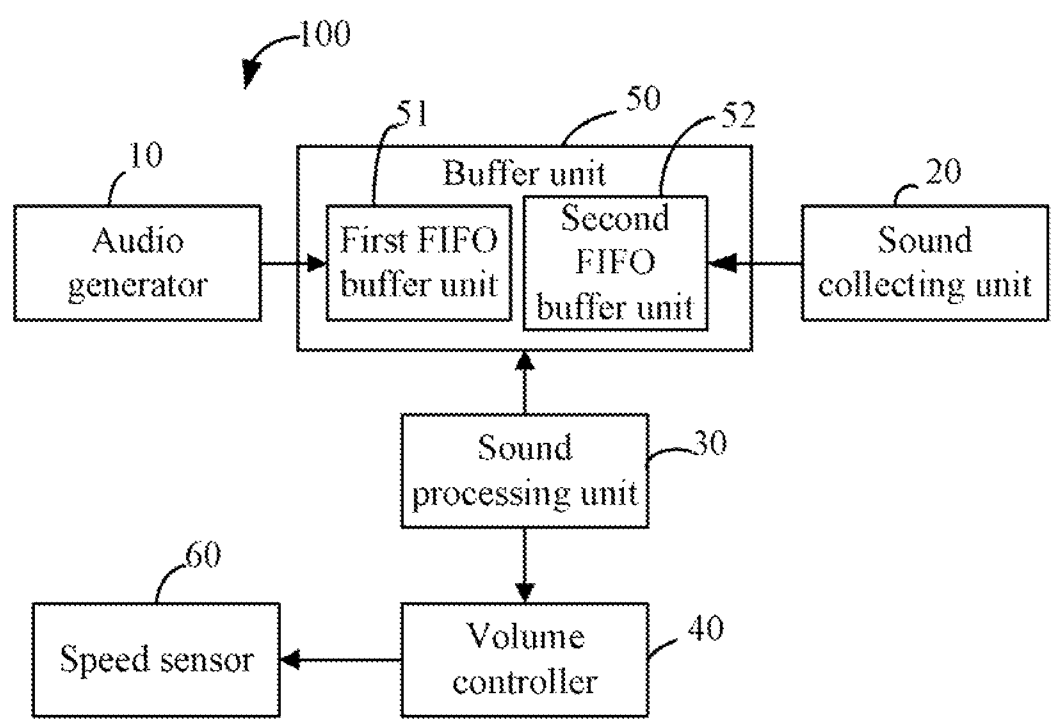
FIG. 1 is a block diagram of an audio device with a volume adjusting function, in accordance with an exemplary embodiment.

Referring to FIG. 1, an embodiment of an audio device 100 with a volume adjusting function is illustrated. The device 100 includes an audio generator 10, a sound collecting unit 20, a sound processing unit 30, a volume controller 40, a buffer unit 50, and a speed sensor 60. The speed sensor 60 senses a speed of the device 100.

The buffer unit 50 includes a first first-in-first out (FIFO) buffer unit 51 and a second FIFO buffer unit 52. The first FIFO buffer unit 51 is for storing audio signals generated by the audio device 100. The second FIFO buffer unit 52 is for storing collected sound signals which may include audio signals and environmental noise signals mixed together.

The audio generator 10 plays multimedia files to generate audio signals, and stores audio signals to the first FIFO buffer unit 51. The sound collecting unit 20 collects ambient sound signals which may include audio signals and environmental noise signals mixed together, and stores collected sound signals to the second FIFO buffer unit 52. The sound processing unit 30 analyzes audio signals in the first FIFO buffer unit 51 and sound signals in the second FIFO buffer unit 52 to determine a waveform of environmental noise signals using known technology, and determines a sound pressure level (SPL) of the environmental noise signals according to the determined waveform. A detail method of analyzing audio signals in the first FIFO buffer unit 51 and sound signals in the second FIFO buffer unit 52 to determine a waveform of environmental noise signals is disclosed in Chinese patent No. CN100464498C issued on Feb. 25, 2009. The volume controller 40 compares the determined SPL with a preset SPL. If the determined SPL is greater than the preset SPL, the volume controller 40 then compares the speed sensed by the speed sensor 60 with a preset speed. If the sensed speed is greater than the preset speed, the volume controller 40 increases the volume of output audio signals to a first value. Otherwise, the volume controller 40 decreases the volume of audio signals to a second value.

In the exemplary embodiment, the audio device 100 is a DVD player used in a car. If the sensed speed is greater than the preset speed, the volume controller 40 determines that the car is moving at a high speed, and the greater noise signals are mainly caused by the movement of the car. Therefore, the volume controller 40 increases the volume of audio signals, and people in the car can listen to music clearly. If the sensed speed is less than the preset speed, the volume controller 40 determines that the car is moving at a low speed, and the greater noise signals are mainly caused by people's talking. Therefore, the volume controller 40 decreases the volume of audio signals, and people's talking may not be bothered.

Figure 2:
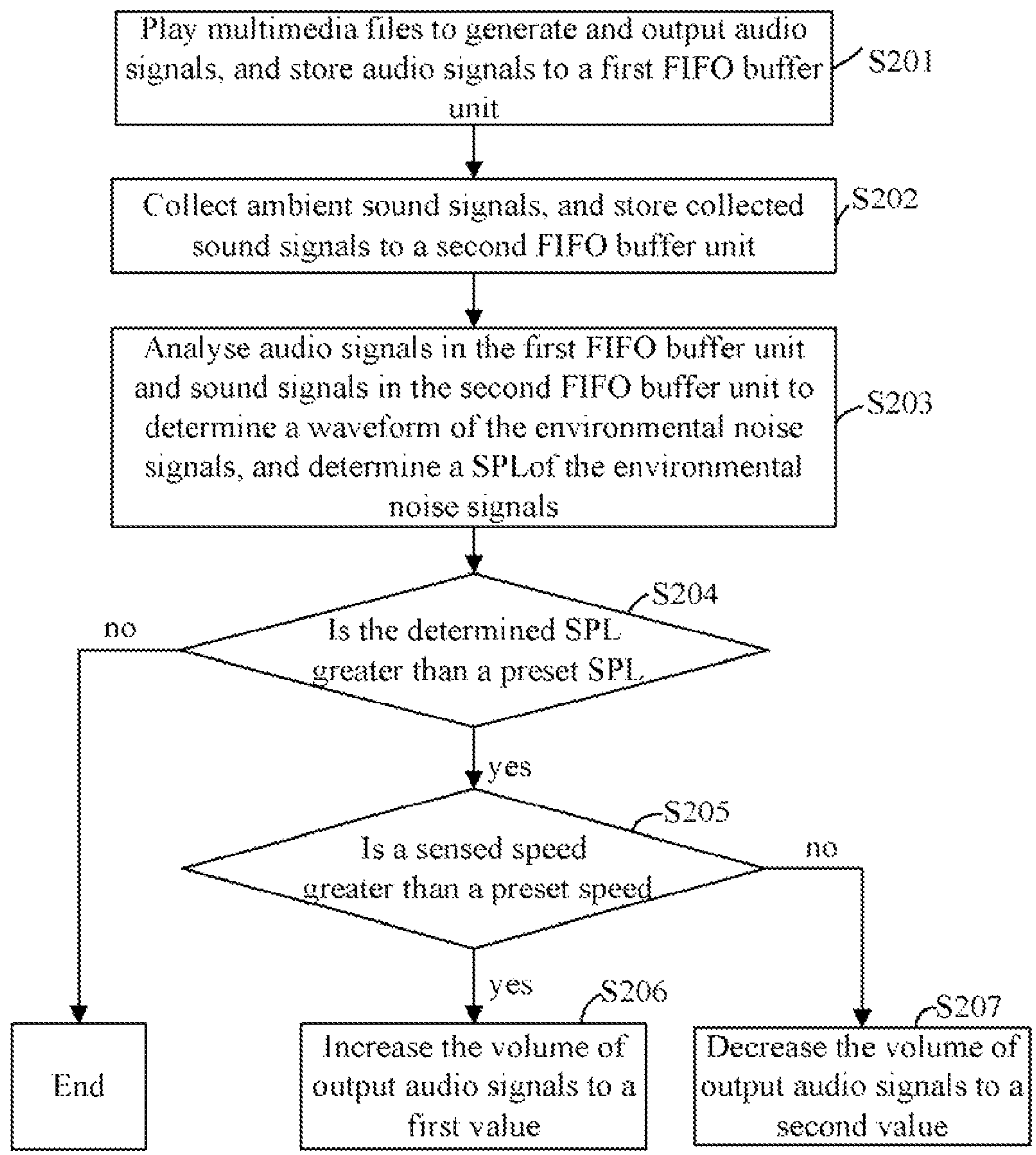
FIG. 2 is a flowchart of a volume adjusting method in accordance with an exemplary embodiment.

FIG. 2 is a flowchart of a volume adjusting method in accordance with an exemplary embodiment.

In step S201, the audio generator 10 plays multimedia files to generate audio signals, and stores audio signals to the first FIFO buffer unit 51.

In step S202, the sound collecting unit 20 collects ambient sound signals which may include audio signals and environmental noise signals mixed together, and stores collected sound signals to the second FIFO buffer unit 52.

In step S203, the sound processing unit 30 analyzes audio signals in the first FIFO buffer unit 51 and sound signals in the second FIFO buffer unit 52 to determine a waveform of environmental noise signals, and determines a SPL of the environmental noise signals according to the determined waveform.

In step S204, the volume controller 40 compares the determined SPL with a preset SPL. If the determined SPL is greater than the preset SPL, the procedure goes to step S205, otherwise the procedure ends.

In step S205, the volume controller 40 compares the speed sensed by the speed sensor 60 with a preset speed. If the sensed speed is greater than the preset speed, the procedure goes to step S206. Otherwise, the procedure goes to step S207.

In step S206, the volume controller 40 increases the volume of output audio signals to a first value.

In step S207, the volume controller 40 decreases the volume of output audio signals to a second value.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. An audio device with a volume adjusting function, comprising: a speed sensor to sense a speed of the audio device;

a first first-in-first out (FIFO) buffer unit;

a second FIFO buffer unit;

an audio generator to play multimedia files to generate audio signals, and store audio signals to the first FIFO buffer unit;

a sound collecting unit to collect ambient sound signals and store collected sound signals to the second FIFO buffer unit;

a sound processing unit to analyze audio signals in the first FIFO buffer unit and sound signals in the second FIFO buffer unit to determine a waveform of environmental noise signals, and further determine a sound pressure level (SPL) of the environmental noise signals according to the waveform of environmental noise signals; and a volume controller to compare the determined SPL with a preset SPL, if the determined SPL is greater than the preset SPL, compare the speed sensed by the speed sensor with a preset speed, and increase the volume of audio signals to a first value if the sensed speed is greater than the preset speed, and decrease the volume of audio signals to a second value if the sensed speed is less than the preset speed.

2. A volume adjusting method applied in an audio device, the audio device comprising a speed sensor to sense a speed of the audio device, a first first-in-first-out (FIFO) buffer, and a second FIFO buffer, the method comprising:

generating audio signals by playing multimedia files, and storing audio signals to the first FIFO buffer;

collecting ambient sound signals and storing collected sound signals to the second FIFO buffer;

analyzing audio signals in the first FIFO buffer unit and sound signals in the second FIFO buffer unit to determine a waveform of environmental noise signals, and determining a sound pressure level (SPL) of the environmental noise signals according to the waveform of environmental noise signals;

comparing the determined SPL with a preset SPL; and comparing the speed sensed by the speed sensor with a preset speed if the determined SPL is greater than the preset SPL;

increasing the volume of audio signals to a first value if the sensed speed is greater than the preset speed; and decreasing the volume of audio signals to a second value if the sensed speed is less than the preset speed.

* * * * *